United States Patent [19]

Nagamachi et al.

[11] Patent Number: 5,582,877
[45] Date of Patent: Dec. 10, 1996

[54] PROCESS FOR MAKING JOSEPHSON JUNCTIONS

[75] Inventors: Shinji Nagamachi, Nara; Masahiro Ueda; Kei Shinada, both of Kyoto; Mitsuyoshi Yoshii, Osaka, all of Japan

[73] Assignee: Shimadzu Corporation, Kyoto, Japan

[21] Appl. No.: 393,905

[22] Filed: Feb. 24, 1995

[30] Foreign Application Priority Data

Feb. 24, 1994 [JP] Japan .................................. 6-026971
Sep. 30, 1994 [JP] Japan .................................. 6-236847
Sep. 30, 1994 [JP] Japan .................................. 6-236848

[51] Int. Cl.$^6$ .................................................. H01L 39/24
[52] U.S. Cl. ........................ 427/529; 427/526; 427/62; 427/63; 505/832; 505/817; 505/874
[58] Field of Search .................. 427/62, 63, 526, 427/529, 530; 505/832, 817, 874; 257/34, 31

[56] References Cited

U.S. PATENT DOCUMENTS

| | | | |
|---|---|---|---|
| 4,412,902 | 11/1983 | Michikami et al. | 427/63 |
| 4,430,790 | 2/1984 | Ohta | 427/63 |
| 4,490,901 | 1/1985 | Clark et al. | 427/63 |
| 5,100,694 | 3/1992 | Hunt et al. | 427/63 |

*Primary Examiner*—Roy V. King
*Attorney, Agent, or Firm*—Nikaido, Marmelstein, Murray & Oram LLP

[57] ABSTRACT

A process for fabricating the Josephson junction includes the steps of preparing a substrate, forming a first superconducting layer, forming a second superconducting layer transversely on the first layer with an insulating layer interposed therebetween wherein the insulating layer is an oxide or nitride of the superconducting material, and injecting ion beams into the insulating layer so as to form low oxygen- or nitrogen-concentrated area linking the first and second layers.

8 Claims, 7 Drawing Sheets

5,582,877

PROCESS FOR MAKING JOSEPHSON JUNCTIONS

FIELD OF THE INVENTION

The present invention relates to a Josephson junction and a process for fabricating Josephson junctions so as to achieve a wide range of practicality such as superconducting quantum interference devices (SQUID) used to measure micromagnetic field like biomagnetism, superconducting flux flow transistors, Josephson FET (JOFET).

BACKGROUND OF THE INVENTION

In general, the Josephson junction is classified into a tunnel type and a micro-bridge type. The tunnel type is fairly popular, but the fabrication involves difficulty in making extremely thin insulating layers, and reducing the size of the junction to a degree where no noise occurs.

The micro-bridge type includes a tiny bridge or link (hereinafter referred to as "link") joining two superconducting electrodes, the link being commonly called "weak link". In theory, this type is advantageous in that the size of the junction can be reduced but actually the fabrication of the tiny links having minute cross-sections and lengths is difficult.

Now, referring to FIG. 9, the conventional process of fabricating a quasi-planar Josephson junction will be described:

The illustrated device includes a lower superconducting layer 101 and an upper superconducting layer 102 transversely overlaid on the lower layer with an insulating barrier or layer 103 interposed therebetween. The upper layer 104 and the lower layer 101 are linked by a link 104 (weak link). Since the length of the link 104 depends upon the thickness of the insulating layer 103, the link 104 can be relatively easily shortened as compared with the conventional planar process applied to micro-bridges.

The conventional process uses electron beam exposure to produce fine lines, and then make them much finer by anode oxidizing. However, this process is inefficient, and the resulting Josephson junctions are irregular in quality. The weak links are liable to secular changes if they are exposed to atmosphere and/or oxidization.

SUMMARY OF THE INVENTION

According to the present invention, there is provided a Josephson junction which includes a substrate, a first superconducting layer, a second superconducting layer transversely overlaid on the first layer with an insulating layer interposed therebetween, the insulating layer is an oxide or nitride of the superconducting material, and the insulating layer including a low oxygen- or nitrogen-concentrated area in contact with each of the first and second layers.

According to another aspect of the present invention, there is a process for fabricating the Josephson junction which comprises the steps of preparing a substrate, forming a first superconducting layer, forming a second superconducting layer transversely on the first layer with an insulating layer interposed therebetween wherein the insulating layer is an oxide or nitride of the superconducting material, and injecting ion beams into the insulating layer so as to form a low oxygen-or nitrogen-concentrated area linking the first and second layers.

DETAILED DESCRIPTION OF THE PREFERRED EMBODIMENT

Figure 1A:
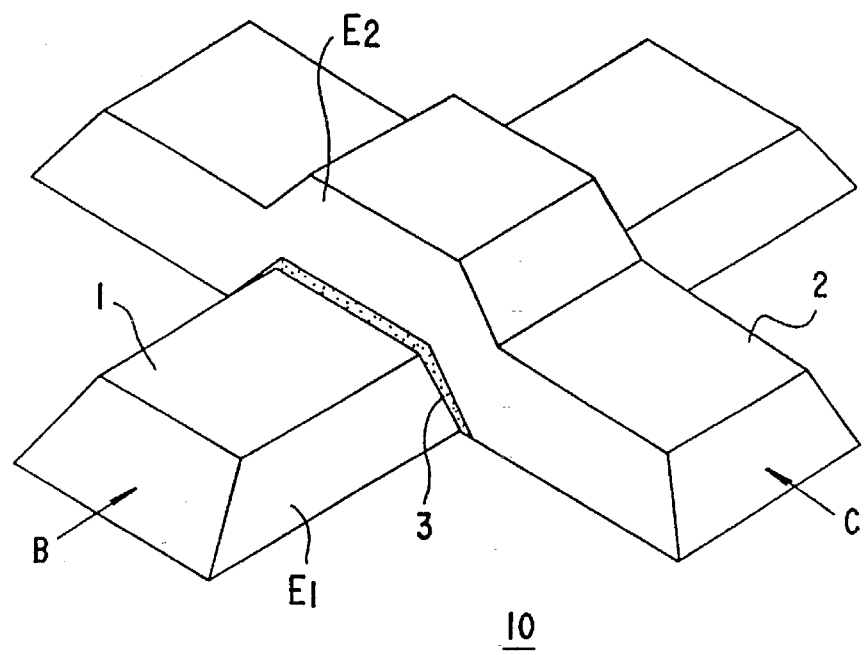
FIGS. 1(A), 1(B) and 1(C) are respectively a perspective view showing a Josephson junction according to the present invention, a side view indicated by the arrow B in FIG. 1(A), and a side view indicated by the arrow C in FIG. 1(A)
Figure 1B:
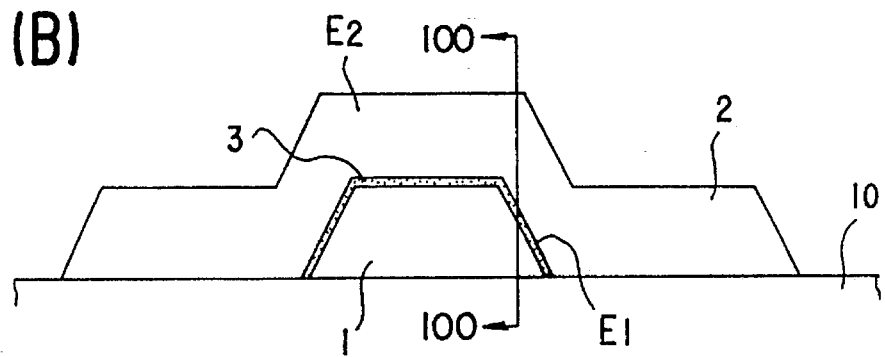
Figure 1C:
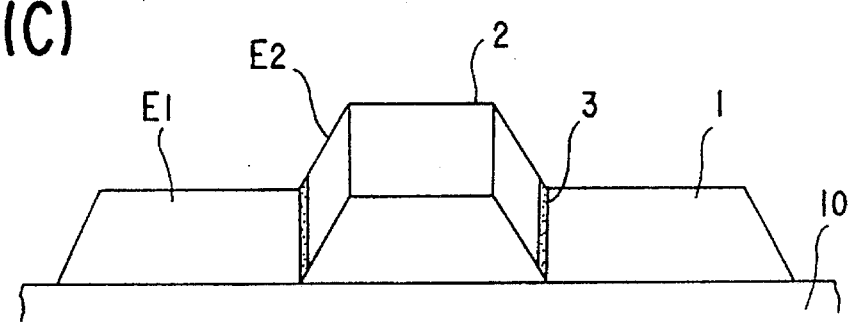

Referring to FIGS. 1(A) to 1(C), a lower electrode 1 is provided on a substrate 10, and an upper electrode 2 transversely overlaid on the lower electrode 1 with an insulating layer 3 interposed therebetween. The upper and lower electrodes 2 and 1 are made of superconducting thin layer as of Nb (niobium), and the insulating layer 3 is made of its oxide such as $Nb_2O_5$.

The sides of each of the upper electrode 2, the lower electrode 1 and the insulating layer 3 are slanted at a predetermined angle to the substrate 10. Thus the lower electrode or layer 1 has slanted sides E1 and the upper electrode 2 has slanted sides E2". The insulating layer 3 has varying thicknesses, that is, the top flat portion is 400 Å thick and the slanted portion on the slanted sides E1 of the lower electrode 1 are 100 Å.

Figure 2:
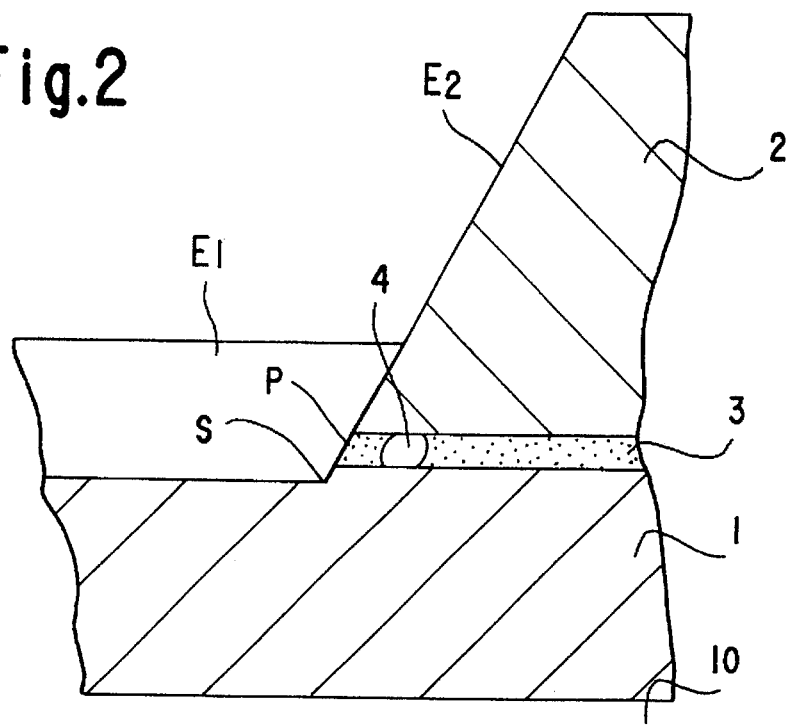
FIG. 2 is a partial cross-sectional view on an enlarged scale taken along the line 100—100 in FIG. 1(B)

Referring to FIG. 2, the insulating layer 3 includes an area 4 in which the concentration of oxygen is low or oxygen atoms are scarce; hereinafter, this area will be referred to as "low oxygen-concentrated area". More particularly, because of the scarcity of oxygen atoms, the Nb atoms are predominantly present in the area 4. Thus the conductivity between the two electrodes 1 and 2 is increased through the Nb element.

As shown in FIG. 2, which shows a vertical cross-section taken along the line 100—100 in FIG. 1(B), especially illustrating a sectional face of the slanted side $E_2$ on an enlarged scale, the low oxygen-concentrated area 4 is present in the insulating layer 3 not on the top surface of the lower electrode 1 but on the slanted sides $E_1$ thereof. An exposed surface of the insulating layer 3 is indicated by P (FIG. 2), and the area a is slightly inside the exposed surface P. The letter S indicates a step S unavoidably procuded in the process of manufacture. The step S is not an essential part of the present invention.

A typical example of the process for fabricating the Josephson junction according to the present invention will be described:

A first Nb thin layer is formed on a substrate 10 and its top surface is oxidized 400 Å thick. Then, the substrate 10 is patterned into a lower electrode 1 by lithography. In the course of patterning the substrate 10 the slanted sides of the lower electrode 1 are formed. The patterned surface is again oxidized 100 Å thick. In this way the lower electrode 1 is covered with an insulating layer of Nb oxide such as $Nb_2O_5$. The insulating layer 3 has two distinct thicknesses, that is, 400 Å thick on the flat top surface of the lower electrode 1, and 100 Å thick on the slanted sides $E_1$ around the lower electrode 1.

Another Nb thin layer is formed on the whole surface of the lower electrode 1, and then the Nb layer and an unnecessary portion of the insulating layer 3 are etched together until an upper electrode 2 is formed. In this way the lower electrode 1 and upper electrode 2 are formed with the insulating layer 3 interposed therebetween as shown in FIG. 1. At this final etching stage the step S is produced.

Figure 3:
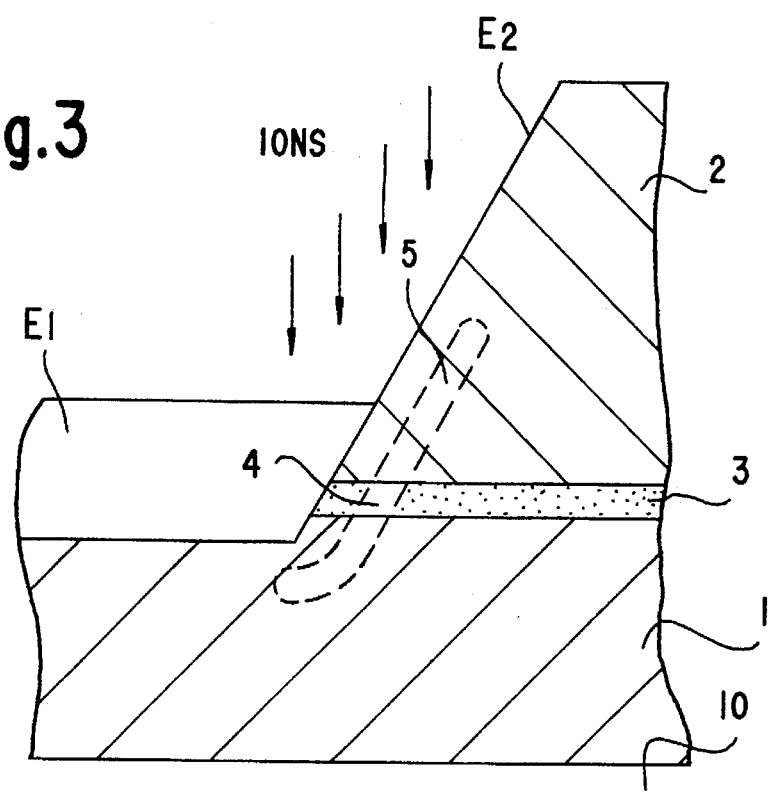
FIG. 3 is a partial cross-sectional view on an enlarged scale showing the process of fabricating the Josephson junction according to the present invention.

At this stage, Nb ions or other suitable ions are injected into a place near the junction of the slanted sides $E_1$ and $E_2$. The ions are injected in a direction normal to the substrate 10 at an energy of 20 to 40 KeV as indicated by the arrows in FIG. 3. Thus an ion layer 5 is formed 50 to 200 Å deep from the slanted surface of the slanted sides $E_2$, wherein the depth is determined in accordance with the ion species and the ion energy. As is evident from FIG. 3, the ion layer 5 and insulating layer 3 intersect each other at right angle at a point where it is presumed that the oxygen atoms are recoiled by the injected ion beams because of their longer range than that of Nb ions, and caught by the upper and lower electrodes 2 and 1, thereby forming the low oxygen-concentrated area 4 where the Nb element is predominant. In this way the weak link is constituted.

It has been found that the Josephson junction fabricated in this way is a typical micro-bridge type having no hysterical tendency in its current-voltage characteristics. The advantage of the micro-bridge type over the tunnel-type was ascertained.

In order to inspect how the characteristics of the Josephson junction changes with time, the junction was placed in a 100% humidity ambience without any cover, and within a 10% change in the critical current values was found for a period of 20 days. This demonstrates that the Josephson junction according to the present invention exhibits an excellent performance with little secular changes.

The thickness of the insulating layer 3 is critically important; if it is as thin as 50 Å, the device will cause a tunnel flow, and result in becoming a tunnel type. However, it has been demonstrated that if it is as thick as 400 Å or more, the junction will be an inadequate weak link.

Figure 4:
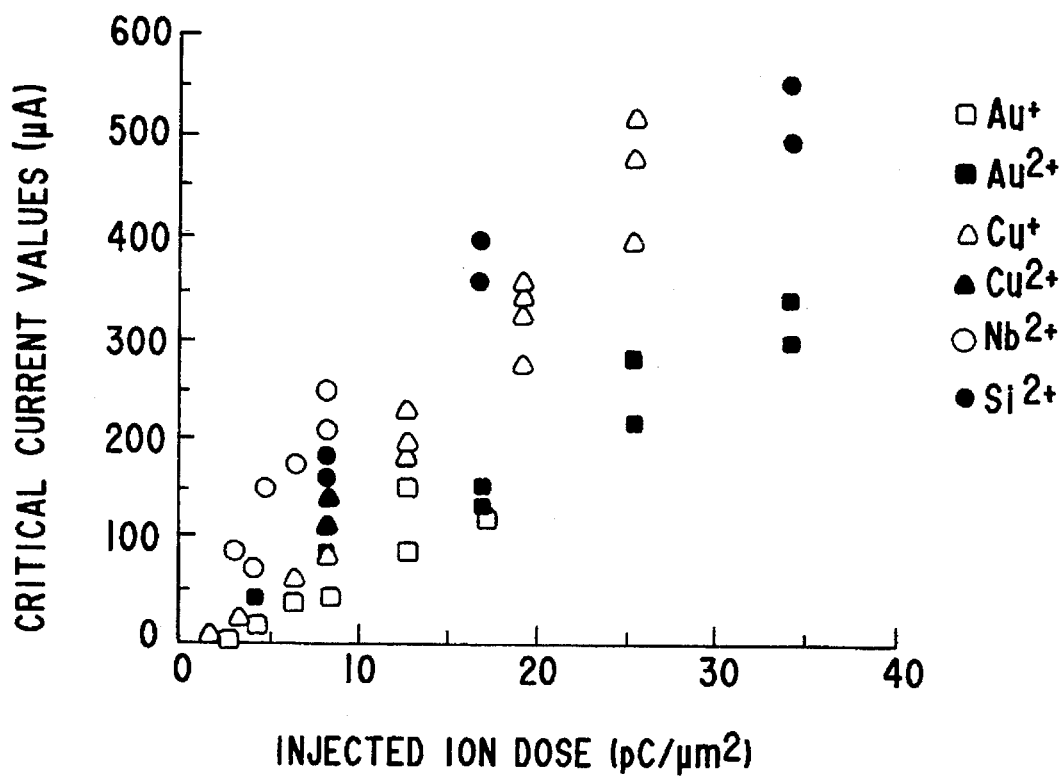
FIG. 4 is a graph showing the relationship among critical current values, ion doses and the ion species.

The ions to be injected are not limited to Nb but can be Au, Cu, or Si. FIG. 4 shows the relationships between the resulting critical current values (µ Å) and the kinds and amounts of injected ions under the structure shown in FIG. 1. The applied energy was 20 KeV for single changed ions and 40 kev for double changed ions.

As is evident from FIG. 4, the relationships between the critical current values and the injected ion doses be injected depicted substantially in a straight line, which exhibits excellent controllability and reproductivity. The inclination of the line varies depending upon the kinds of ions to be injected.

As described above, the formation of the low oxygen-concentrated area 4 is presumed to be derived from a local reduction of the insulating layer 3 owing to the recoil of oxygen atoms by the injected ion beams. This presumption will be supported by the following observation:

First, the resulting junction has no hysteresis in the current-voltage characteristics. Second, the ion beam to be injected are not limited to Nb but can be selected from a wide range of elements such as Au, Cu, and Si. Third, if the insulating layer 3 is too thick, the expected weak link will not be formed at the thick portion by ion injection.

It will be understood from the observations that the thickness of the insulating layer 3 is critically important; if the insulating layer 3 is too thick, the oxygen atoms are likely to remain inside the layer 3 irrespective of the drive of injected ion beams, and fail to reach either the lower electrode 1 or the upper electrode 2. When the thickness of the layer 3 is optimum, the oxygen atoms are driven out and absorbed by the lower and upper electrodes 1 and 2, thereby forming a desired low oxygen-concentrated area 4 as a weak link.

It can be concluded from the observations that ions to be injected are not limited to Nb, Au, Cu or Si but other ion species and high-speed neutral atoms can be used if they have the ability of driving oxygen atoms.

The substance of the insulating layer 3 is not limited to $Nb_2O_5$ or similar superconducting metal oxides but superconducting nitrides can be used provided that they function as an insulator and can exhibit proximity effect when they are near to the electrodes 1 and 2 of superconductor; for example, oxides or nitrides of metals such as Al or of semiconductors such as Si. Ion beams or neutral atom beams to be injected are selected from those capable of recoiling oxygen or nitrogen atoms depending upon the oxides or nitrides of the insulating layer 3. Herein, the proximity effect means a phenomenon in which a conductor having no superconducting capacity by itself is transited to a superconductor when it is brought into proximity with superconductors.

Figure 5:
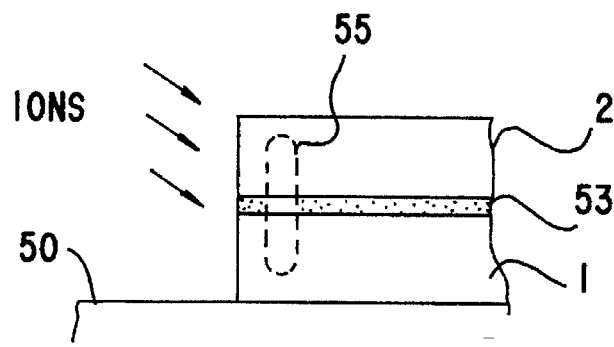
FIG. 5 is a partial cross-sectional view on an enlarged scale showing a modified version of the process of fabricating the Josephson junction according to the present invention.
Figure 6A:
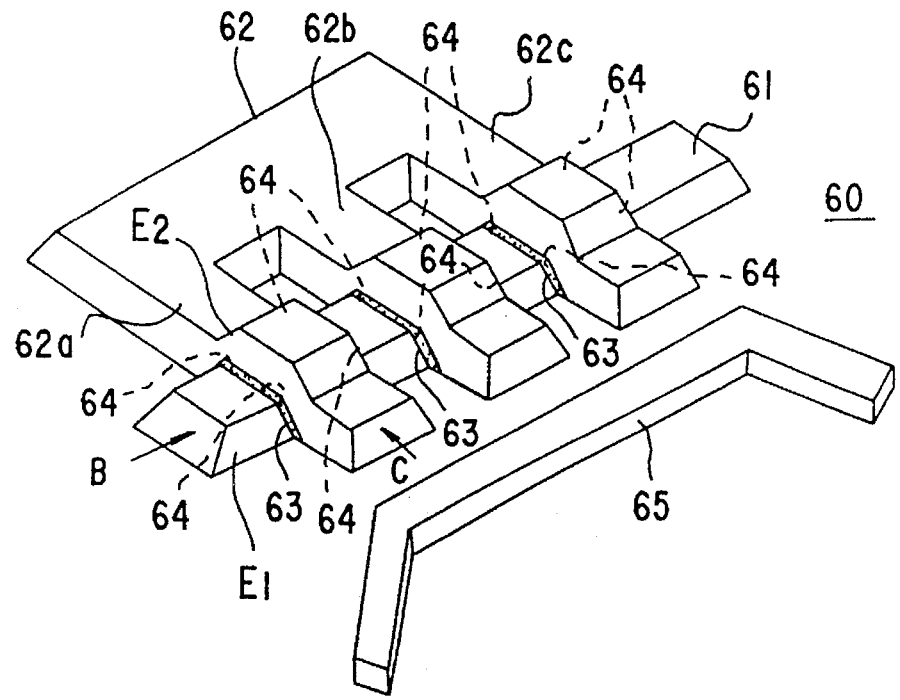
FIGS. 6(A), 6(B), 6(C) and 6(D) are respectively a perspective view showing a superconducting flux flow transistor to which the Josephson junction according to the present invention is applied, a side view indicated by the arrow B in FIG. 1(A), a side view indicated by the arrow C in FIG. 1(A), and a partial cross-sectional view on an enlarged scale taken along the line 200—200 in FIG. 6(B)
Figure 6B:
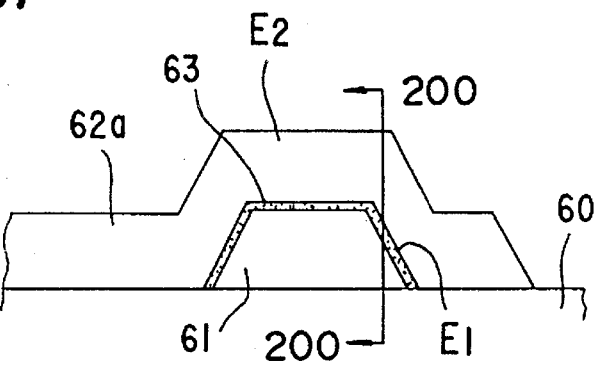
Figure 6C:
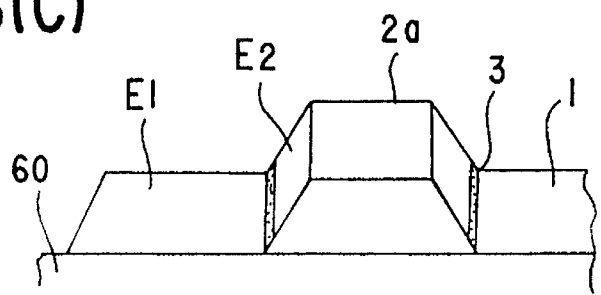
Figure 6D:
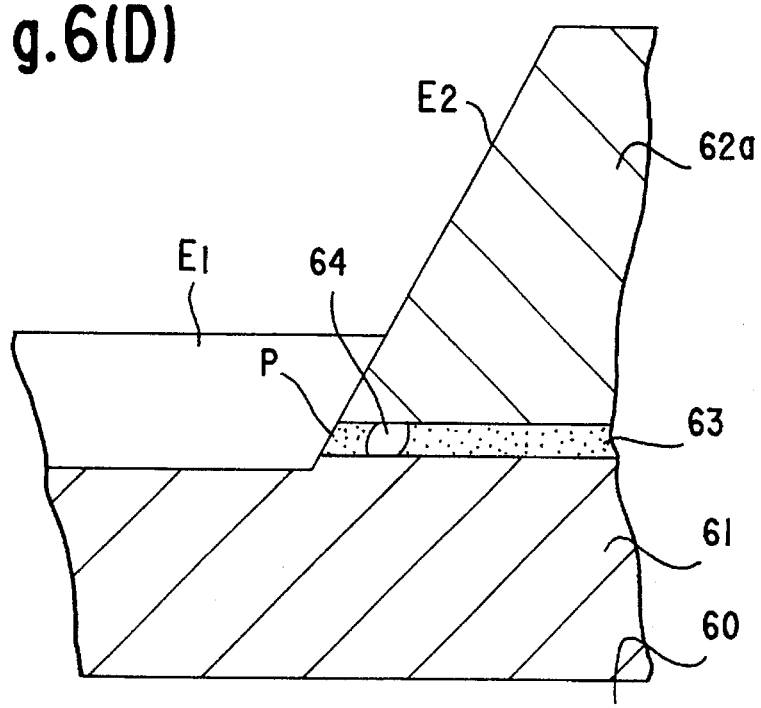

In the example described above, the ion beam injection is applied at right angle to the substrate 10 toward that portion of insulating layer 3 which is situated on the slanted sides $E_1$. An alternative process is to decline the substrate 50 so that the ion injection becomes slanted toward an insulating layer 53 in parallel with the substrate 10. Alternatively, ions may be diagonally injected as indicated by the arrows in FIG. 5.

In the example described above, the weak links are formed as a low oxygen-concentrated or nitrogen-concentrated area formed by injecting ion beams into the insulating layer 3 sandwiched between the lower and upper electrodes 1 and 2. Alternatively, the insulating layer may be formed of a substance such as Al or semiconductor having proximity effect when they are brought into proximity with the upper and lower superconducting layers, and the insulating layer may have a low oxygen- or low nitrogen-concentrated area, as the case may be.

The Josephson junction described above can be applied to DC-SQUID and RF-SQUID.

A DC-SQUID is a device which is provided with two Josephson junctions in a superconducting loop, and a terminal is taken out from each Josephson junction. When each terminal is appropriately biased, an output voltage V periodically changes for an input magnetic flux φ.

The periodic cycle is a physical quantum in terms of magnetic flux quantum. The V– φ relationship is non-linearly represented but by adding a proper feedback circuit (FLL: flux locked loop) to it, a linear magnetic detector can be constituted. An RF-SQUID is a device used to measure magnetism, which is provided with a single Josephson junction in a superconducting closed loop.

Referring to FIGS. 6(A) to 6(D), other examples of the applications will be described:

A straight lower electrode 61 is formed on a substrate 60 and an upper electrode 62 including branches 62a, 62b and 62c each overlaid on the lower electrode 61 with insulating layers 63 interposed therebetween. The branches 62a, 62b and 62c have foot portions which join at the base portion of the upper electrode 62 so as to constitute an integer. As a whole the upper electrode 62 looks like the letter E.

Alongside the straight lower electrode 61 there is provided a control line 65 through which control signals are transmitted, as described below.

The lower electrode 61, upper electrode 62 and control line 65 are thin Nb layers, and the insulating layers 63 are Nb oxide such as $Nb_2O_5$.

The slanted sides of the lower electrode 61, insulating layers 63 and upper electrode 62 are inclined at a predetermined angle to the substrate 60. The lower electrode 61 has lengthwise slanted sides $E_1$ and the upper electrode 62 has lengthwise slanted sides $E_2$. These slanted sides $E_1$ and $E_2$ intersect at right angle. Each of the insulating layers 63 is about 400 Å on the top surface of the lower electrode 61 and about 100 Å on the slanted sides $E_1$ thereof.

Figure 7:
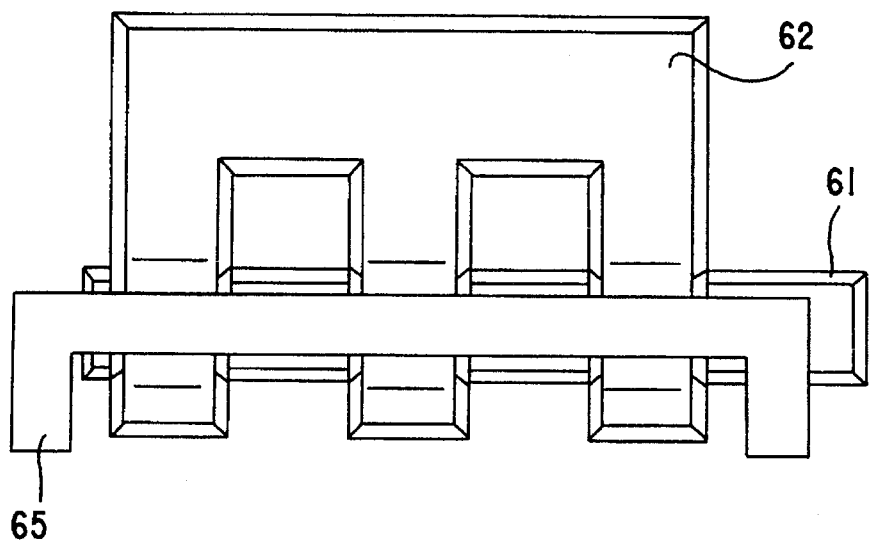
FIG. 7 is a plan view showing a modified version of the superconducting flux flow transistor shown in FIGS. 6(A) to (D)

As shown in FIG. 2, one unit of the slanted sides $E_1$ and $E_2$ has four weak links (low oxygen-concentrated or nitrogen-concentrated) areas 64, and then totally the illustrated junction has twelve weak links. The weak links 64 are produced in the same manner as described by reference to FIG. 2. Since the insulating layers 63 are located near the control line 65, a magnetic field produced by passing a control current through the control line 65 and a magnetic field produced in each weak link 64 attract each other. In this way a current flowing through the weak links 64 is modulated by the magnetic field produced in the control line 65. Supposing that the control current is a base current, the relationship between the voltage V across the lower electrode 61 and the upper electrode 62 and the current I flowing through the weak links 64 becomes similar to that between a collector voltage and a collector current in an ordinary transistor. Thus a superconducting flux transistor is obtained. Each weak link 64 can be shorter than a coherence length. It is possible to pile the Nb superconducting layers in multi-stage with insulating layers interposed therebetween. As shown in FIG. 7, it is also possible to provide the control line 65 on the upper electrode with an insulator therebetween. Alternatively, a plurality of control lines 65 can be provided on either the lower electrode or the upper electrode with insulators interposed therebetween. These modifications enhances the magnetic bond between the control lines and weak links, and the integrity of the device.

Figure 8A:
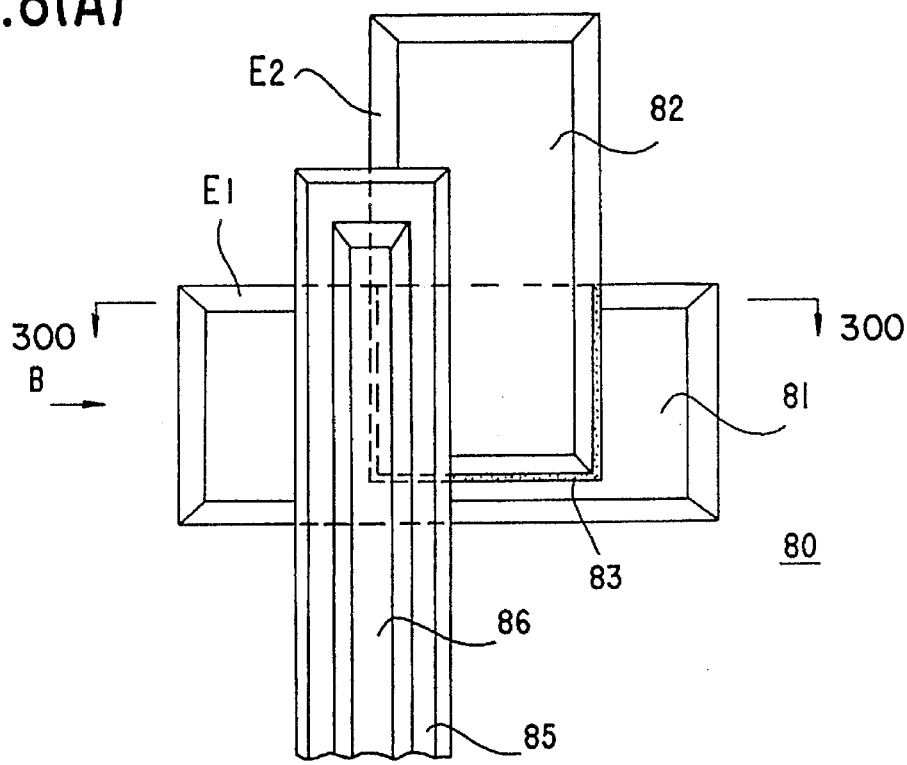
FIGS. 8(A), 8(B) and 8(C) are a schematic plan view exemplifying a JOFET to which the Josephson junction according to the present invention is applied, a left side view indicated by B in FIG. 8(A), and a cross-sectional partical view taken along the line 300—300 in FIG. 8(B)
Figure 8B:
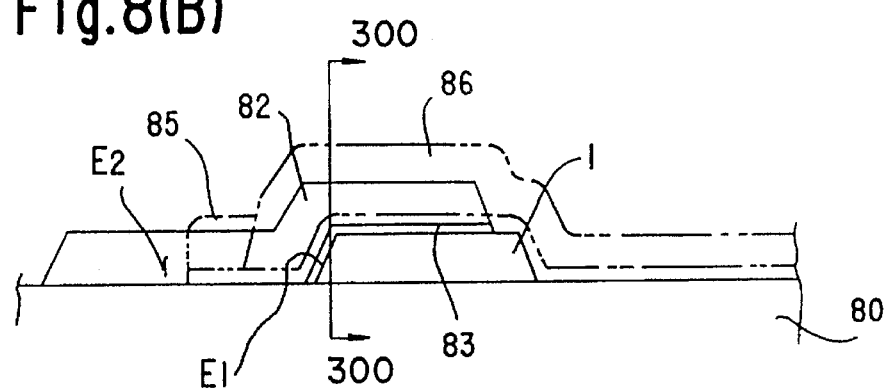
Figure 8C:
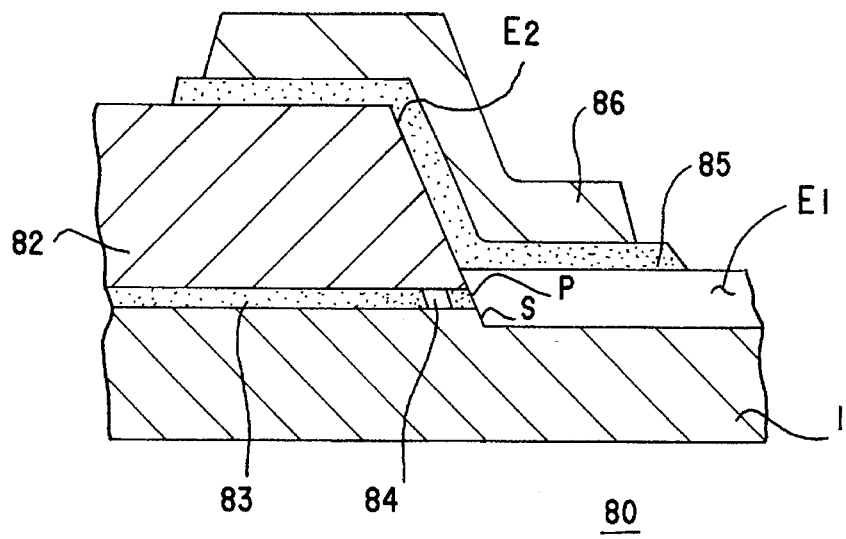
Figure 9:
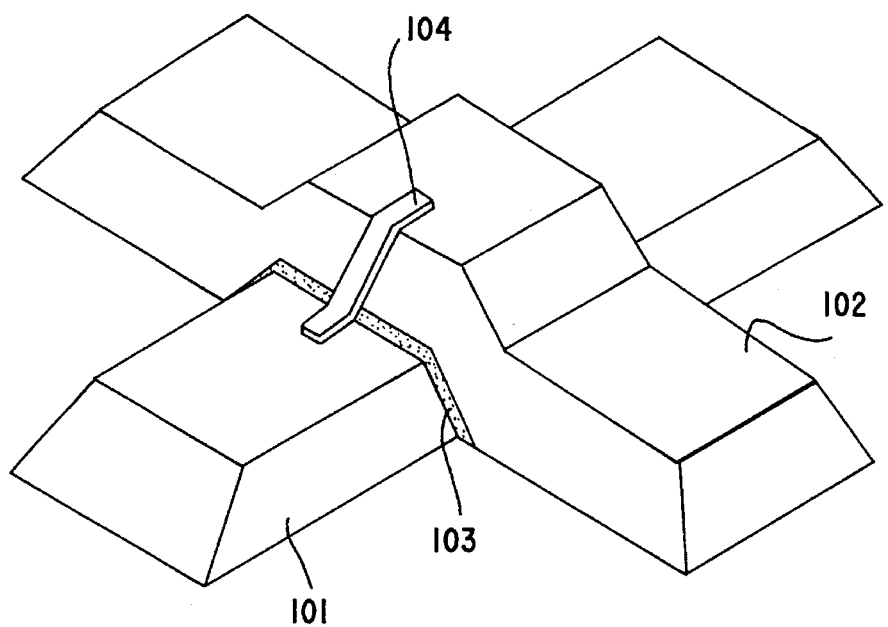
FIG. 9 is a perspective view showing a prior art quasi-planar Josephson junction.

Referring to FIGS. 8(A) to 8(C), a Josephson FET (JOFET) to which the present invention is applied will be described:

The exemplary junction includes a first superconducting layer 81 formed on a substrate 80, and a second superconducting layer 82 partly overlaid on the first superconducting layer 81 with an insulating layer 83 interposed therebetween. The first and second superconducting layers 81 and 82 are made of Nb, and the insulating layer 83 is Nb oxide such as $Nb_2O_5$. The slanted sides of the first and second superconducting layers 81 and 82, and the insulating layer 83 are inclined to the substrate 80. The slanted sides facing in a direction (B) is indicated by $E_2$ and the slanted sides perpendicular to the slanted sides $E_2$ are indicated by $E_1$. As shown in FIG. 8(C), a low oxygen-concentrated area 84 is formed slightly inside the exposed surface P of the insulating layer 83, so as to constitute a weak link.

In addition, as shown in FIG. 8(C), a second insulating layer 85 is added over the first and second superconducting layers 81 and 82, and a gate electrode 86 is laid on the second insulating layer 85. The gate electrode 86 is made of Au, and the insulating layer 85 is made of $SiO_2$.

Since the gate electrode 86 is located above and adjacent to the weak link 84, extending over the slanted side $E_2$ of the second superconducting layer 82. When the gate electrode 86 is biased, an electric field is impressed on the weak link 84. When an electric field acts on the weak link 84, the amplitude of a Josephson current changes. Suppose that the first layer 81 is a source and the second layer 82 is a drain, the relationship between a source-and-drain voltage and a current flowing through the weak link 84 is modulated by a potential applied to the gate electrode 86. In this way the device shown in FIG. 8 functions as an FET type superconducting transistor, commonly called Josephson FET (JOFET).

One advantage of the JOFET shown in FIG. 8 is that the length of the weak link can be made shorter than a coherence length of Nb or almost equal to the thickness of the insulating layer 83, which is contrast to a conventional JOFET mainly processed by electron beam lithography.

What is claimed is:

1. A process for fabricating a Josephson junction comprising the steps of:

preparing a substrate;

forming a first layer of superconducting material on said substrate;

forming a second layer of superconducting material transversely on the first layer with an insulating layer interposed therebetween wherein the insulating layer is an oxide of the superconducting material; and injecting ion beams into the insulating layer, thereby forming an area between the first and second layers which has a lower oxygen concentration than the insulating layer.

2. The process according to claim 1, wherein the superconducting material is Nb and the insulating layer is formed by oxidising the first layer.

3. The process according to claim 1, further comprising the steps of oxidising the surface of the first layer to a first depth prior to the formation of the second layer, patterning each side of the first layer until the side has a slanted face, oxidising the same surface to a second depth which is shallower than the first depth, forming the second layer, patterning each side of the second layer until the side has a slanted face, wherein the slanted sides of the first layer and the second layer intersect, and the ion injection is applied in a direction normal to the substrate to the intersection of the slanted sides of the first and second layers.

4. The process according to claim 1, wherein the ion beam injection is applied in a diagonal direction.

5. A process for fabricating a Josephson junction comprising the steps of:

preparing a substrate;

forming a first layer of superconducting material on said substrate;

forming a second layer of superconducting material transversely on the first layer with an insulating layer interposed therebetween wherein the insulating layer is a nitride of the superconducting material; and injecting ions into the insulating layer thereby forming an area between the first and second layers which has a lower nitrogen concentration than the insulating layer.

6. The process according to claim 5, wherein the ion beam injection is applied in a diagonal direction.

7. A process for fabricating a Josephson junction comprising the steps of:

preparing a substrate;

forming a first layer of superconducting material on said substrate;

forming a second layer of superconducting material transversely on the first layer with an insulating layer interposed therebetween wherein the insulating layer is an oxide of a substance having proximity effect for the superconducting material of the first and second layers; and injecting ion beams into the insulating layer, thereby forming an area between the first and second layers which has a lower oxygen concentration than the insulating layer.

8. A process for fabricating a Josephson junction comprising the steps of:

preparing a substrate;

forming a first layer of superconducting material on said substrate;

forming a second layer of superconducting material transversely on the first layer with an insulating layer interposed therebetween wherein the insulating layer is a nitride of a substance having proximity effect for the superconducting material of the first and second layers; and injecting ion beams into the insulating layer thereby forming an area between the first and second layers which has a lower nitrogen concentration than the insulating layer.

* * * * *